(12) United States Patent
Widhammer et al.

(10) Patent No.: US 8,294,479 B2
(45) Date of Patent: Oct. 23, 2012

(54) DOCKING DRIVE, LOCKING ELEMENT, DOCKING SYSTEM

(75) Inventors: Andreas Widhammer, Bad Aibling (DE); Thomas Kolb, Oberaudorf (DE)

(73) Assignee: Esmo AG, Rosenheim (DE)

( * ) Notice: Subject to any disclaimer, the term of this patent is extended or adjusted under 35 U.S.C. 154(b) by 943 days.

(21) Appl. No.: 11/570,955

(22) PCT Filed: Jun. 29, 2005

(86) PCT No.: PCT/EP2005/006992
§ 371 (c)(1), (2), (4) Date: Aug. 21, 2008

(87) PCT Pub. No.: WO2006/000461
PCT Pub. Date: Jan. 5, 2006

(65) Prior Publication Data
US 2009/0261842 A1  Oct. 22, 2009

(30) Foreign Application Priority Data
Jun. 29, 2004 (DE) .......................... 10 2004 031 426

(51) Int. Cl.
*G01R 31/00* (2006.01)

(52) U.S. Cl. .......... 324/750.16; 324/750.22; 324/756.01

(58) Field of Classification Search .................. None
See application file for complete search history.

(56) References Cited

U.S. PATENT DOCUMENTS

| 4,705,447 | A | * | 11/1987 | Smith | 414/590 |
| 5,295,853 | A | * | 3/1994 | Nagakusa et al. | 439/330 |
| 5,654,631 | A |   | 8/1997 | Ames |   |
| 5,982,182 | A |   | 11/1999 | Chiu et al. |   |

FOREIGN PATENT DOCUMENTS

| DE | 102 16 003 A1 | 11/2003 |
| DE | 102 45 865 A1 | 4/2004 |

OTHER PUBLICATIONS

European Patent Office, International Search Report, Application No. PCT/EP2005/006992, Dec. 28, 2005.
Abstract DE10245865, Apr. 15, 2004.
Abstract DE10216003, Jun. 11, 2003.

\* cited by examiner

*Primary Examiner* — Paresh Patel
(74) *Attorney, Agent, or Firm* — Wood, Herron & Evans, LLP

(57) ABSTRACT

A docking drive for a testing head comprising a plurality of locking mechanisms (10) each provided with an own locking drive (14, 21-28) comprises a synchronizing device (11, 12, 13) synchronizing the locking drives (14, 21-28) of the locking mechanisms (10). It may comprise a respective trapping device (15a, b) provided in a plurality of locking mechanisms (10) each retaining a locking element (50) to be locked in the respective locking mechanism (10) in a certain position. A locking element (50) of a docking system comprises a base (51), a locking section (55) and a connecting mechanism (52-54) provided between the base (51) and the locking section (55) and being manually releasable without tools. The locking section (55) may be resiliently supported opposite of the base (51). The locking element may comprise a first retaining section (56) for the trapping device (15) and a second retaining section (57) for a locking device (16).

9 Claims, 5 Drawing Sheets

DOCKING DRIVE, LOCKING ELEMENT, DOCKING SYSTEM

The invention relates to a docking drive, a locking element and a docking system according to the preambles of the independent claims. FIG. 5 shows where such docking systems are used. 63 designates a handler or sampler for highly integrated circuits one of which is designated by 69. It may be exclusively digital components or digital and analogous circuits on once chip. It may be integrated modules working at high and highest frequencies. For many applications a 100% testing of all ICs to be produced is scheduled, be it before they are cast into a plastic housing (the test will then be carried out in a so-called "sampler") or after they have been cast into a plastic housing (the test will then be carried out in a so-called "handler").

With an increasing integration and operating frequency the geometrical dimensions of and the intervals between the contacts decrease. At the same time their number and the size of the chip increase. Contacting such chips for testing purposes is not a trivial matter, particularly if it is to be carried out rapidly, routinely and at the same time in a—electrically as well as mechanically—reliable and non-destructive manner.

Samplers or handlers 63 establish the direct contacts to the chip or IC 69 to be tested and may be provided with further electronics. The actual test of the chip or IC 69, however, is carried out by a separately advanced testing head 61. Such testing heads are, in the meantime, massive, large and heavy components. At present weights of 1,000 kg or more are common. Testing heads 61 are moved by manipulators 62 which allow a movement of the testing head 61 along a plurality of translational and rotational axes so that the contacts 67 of the testing head 61 can reach the contacts of the handler or sampler 63. To keep the connection mechanically as well as electrically reliable for the duration of the test a reliable and non-destructive mechanical connection of the involved components is required. Particularly in view of high frequency applications and high frequency tests the connection must be so that even smaller shocks will not electrically influence the test run.

To connect the testing head 61 with the handler or sampler 63 a docking system 10, 50 is required. The way of application is, in this case, such that an operator moves the testing head 61 to the vicinity of the handler or sampler 63 by means of a manipulator 62 so that the components of the docking system 10, 50 engage in a pre-docking position. Starting from there the final locking is then practically effected automatically without the necessity or possibility of a further intervention of the operator.

A docking system 10, 50 comprises, on the one hand, components provided on the side of the testing head 61 and, on the other hand, on the side of the handler or sampler 63 or on the side of an upstream stiffening frame which may be regarded as a part of the handler or sampler. They interact so that the components interact in respective pairs during the docking operation, i.e. during the automated process after the operator has manually shifted the components, so that a certain distance in the z-direction is covered and that here also an accurate mechanical positioning and aligning as well as a fixed retaining of the components in the final position are effected. Here regularly a plurality of pairs of respective components 10 and 50 are provided which will then simultaneously cooperate to effect the docking during the docking process.

After the docking process the actual testing of the chips is carried out. Then the connection is released again so that the next chip can be tested.

Known docking systems comprise four pairs of the components 10 and 50. 10 may be an active, driven component while 50 may be a passive component. The plurality of active components is simultaneously driven until the docking process is completed. Since quite massive forces are to be applied here (a total of several hundred kilograms resulting from weight forces and spring forces of the contacts to be approached) correspondingly powerful active components are required. When these work simultaneously in the plurality of components 10 problems may occur if the mode of operation is not mechanically synchronised. Since only the slightest mechanical tolerances are permissible due to the electric contacts while, at the same time, high forces are to be applied, tilting and as a result, in the best case, a "half-way" stalling of the docking process may occur. However, components may also be destroyed.

A further drawback of known docking systems is that a manual movement of the testing head including its docking system components towards the handler or sampler including its docking system components may be difficult. The automatic part of the docking process can only be started when all pairs 10, 50 are in the prescribed starting position (pre-docking position). It may become difficult, particularly power-intensive and time-consuming until all of these positions are reached simultaneously so that the automatic process may be started.

A further drawback of known docking systems is that they are only releasable again by an electric operation of the system. In case of errors this may lead to problems. An error of the docking system would then block the testing head 61 as well as the handler or sampler 63.

Furthermore there may be applications in which the completely rigid connection between the testing head 61 and the handler or sampler 63 is undesirable which is, however, omnipresent in conventional docking systems.

It is the object of the invention to provide a docking drive, a locking element and a docking system which handle pre-docking and the actual docking process in a simple and reliable manner and which can be released rapidly in case of a failure.

Said objects are solved by the features or the independent claims. The dependent claims relate to preferred embodiments of the invention.

A docking drive for a component of a test system such as a testing head, a handler, a sampler or a stiffening frame comprises a plurality of locking mechanisms which respectively comprise a locking drive. A synchronisation device brings about a smooth docking operation and prevents, in particular, tilting or a strongly unsymmetrical operation of the individual locking mechanisms.

The synchronisation device may synchronise the locking drives of the locking mechanisms, for example in accordance with sensor signals from the individual drives, by driving all locking drives appropriately, for example so that faster running locking drives are controlled depending on the slowest one.

A docking drive which may but need not be formed as described above may comprise a trapping device provided in several or all locking mechanisms for respectively retaining a corresponding locking element in a certain position, particularly in the starting position for the automated docking process (in the pre-docking position). In this way the individual pairs 10, 50 can be subsequently and preliminarily connected to each other in the predetermined position by the operator during pre-docking by retaining the components in the pre-docking position using the trapping device. If the pre-docking position is reached at all of the pairs 10, 50 the automated part of the docking can be started.

The trapping device prevents the operator from having to ensure himself that all of the pairs 10, 50 are in a preliminarily engagement with each other at the same time. He can rather establish this state at one individual pair after the other. The trapping device will then preliminarily retain the pairs in the respective pre-docking position until the automatic docking process is started.

One component of the docking system, particularly respectively one element of the pairs 10, 50 may comprise a base and a locking sector which are connected by a connecting mechanism which can be released manually and preferably without tools. In this way the docking system may be released even when individual components or even, for example, the current or other energy supply will fail.

A locking element may also be partly resiliently supported to meet the requirements of specific applications.

A docking system may comprise a docking drive as well as locking elements as described above. The docking drive may be provided on the side of the testing head or on the side of the handler or sampler or the stiffening frame. On the respectively other side correspondingly the locking elements are provided. For each locking mechanism of the docking drive a locking element may be provided, respectively, the positions with respect to each other being selected correspondingly. Three or more, preferably four or six pairs consisting of a locking mechanism and a locking element may be provided.

Individual embodiments of the invention will be described below with reference to the drawings in which.

Figure 1:
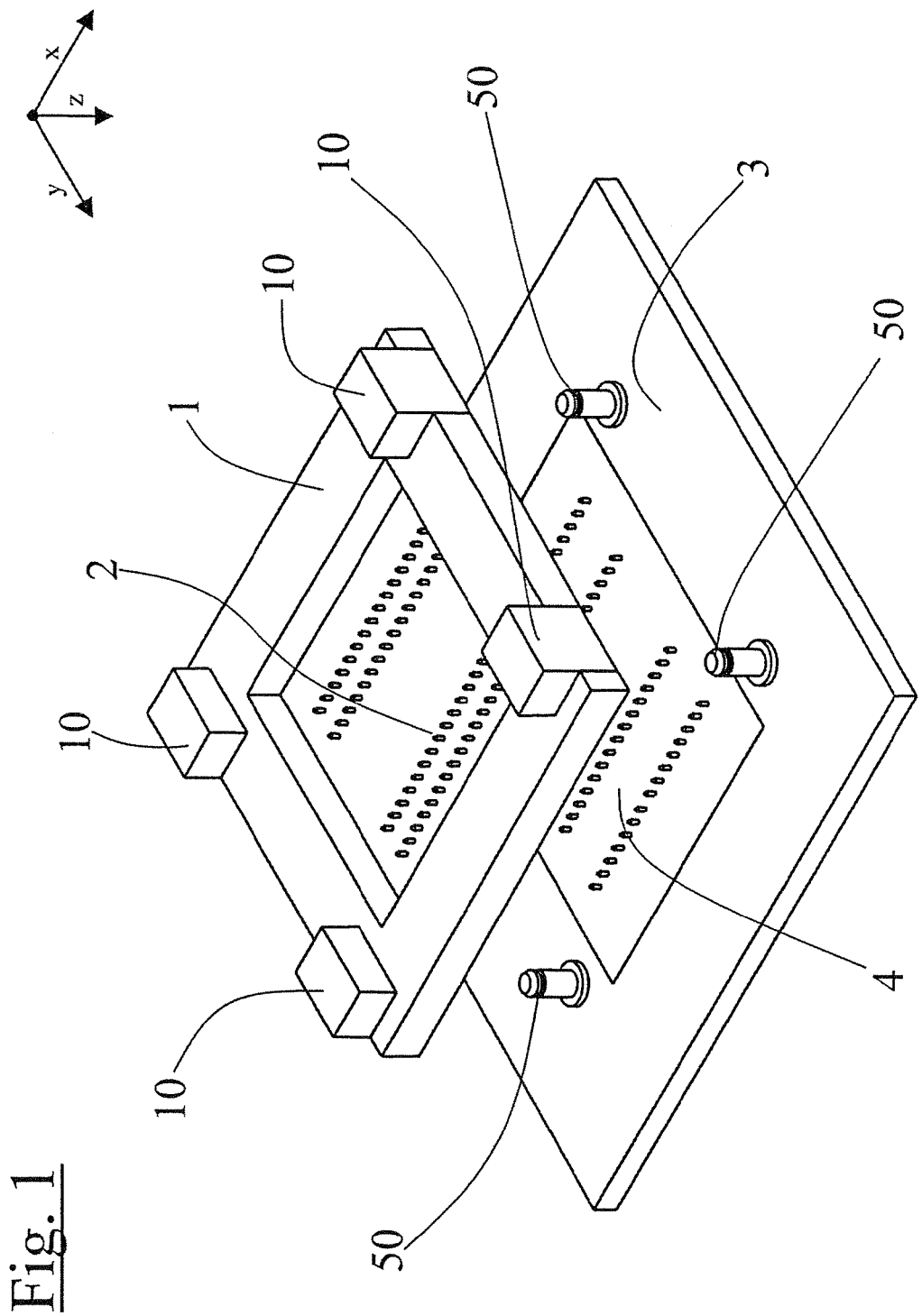
FIG. 1 shows a docking system to which the present invention may be applied.

FIG. 1 is a perspective view of a docking system. The other system components respectively connected to the shown components, i.e. particularly the testing head 61 and the handler/sampler/stiffening frame 63 are not shown. Only those system components which directly establish the contact are shown. In FIG. 1 the docking drive 1 is positioned on the upper side while the plurality of locking elements 50 are to be seen on the lower side. The docking drive 1 comprises a plurality of locking mechanisms 10 for which corresponding locking elements 50 are provided on a support 3 of the handler/sampler/stiffening frame 63, respectively. During the pre-docking process the docking drive including its locking mechanisms 10 is placed on the locking elements 50, i.e. moved further downwards in the z-direction than shown in FIG. 1, by the operator. In the following description it is assumed that the docking drive is provided on the side of the testing head 61 and that the locking elements are provided on the side of the handler/sampler/stiffening frame 63. It may, however, also be vice versa.

Inside of the docking drive 1 a so-called "configuration board" 2 is schematically shown with the aid of which comprehensive adjustments between the hardware of the testing head 61 and the chips to be tested or upstream electrical components may be carried out. Inside of the support 3 of the locking elements 50, for example, a so-called "performance board" 4 may be stably supported which in turn is connected to the chip or component to be tested. The electric contact is then established directly by the configuration board 2 and the performance board 4 cooperating during the docking operation. For this purpose they may comprise resilient, spring-biased pins 67 as well as contact surfaces 68 which are connected during the docking process and thus establish the electric contact.

Figure 2:
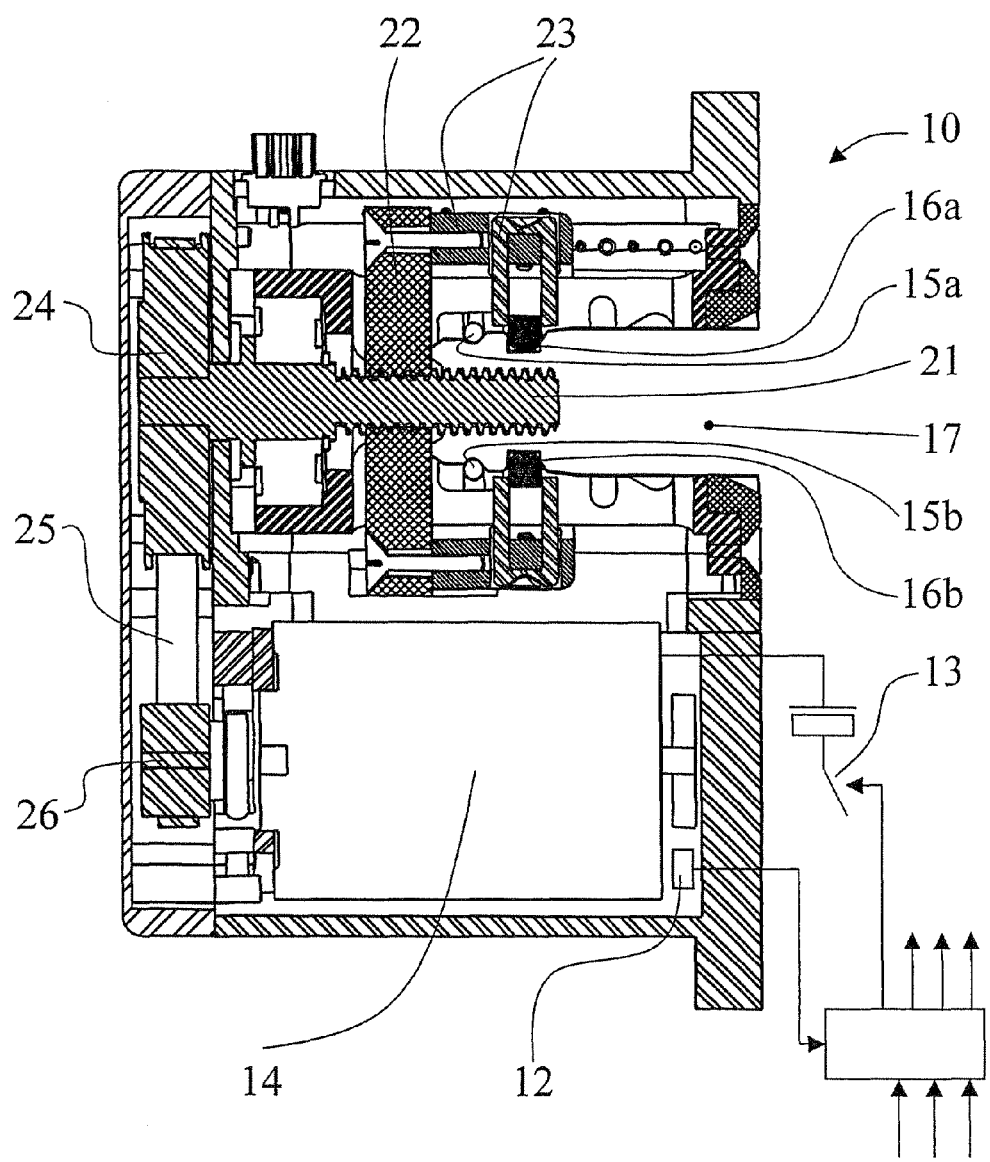
FIG. 2 is a cross sectional view of a locking mechanism.

FIG. 2 is a cross sectional view of a locking mechanism 10. The docking drive 1 shown in FIG. 1 comprises four of said locking mechanisms 10. In this connection please not that the same numerals denote identical components throughout the whole application. The indicated coordinate systems have an identical orientation. The z-direction is the direction of movement during the docking process. The "docking path" is directed in the z-direction, and it is the path between the position of the components at the end of the pre-docking process and the final position.

Figure 3:
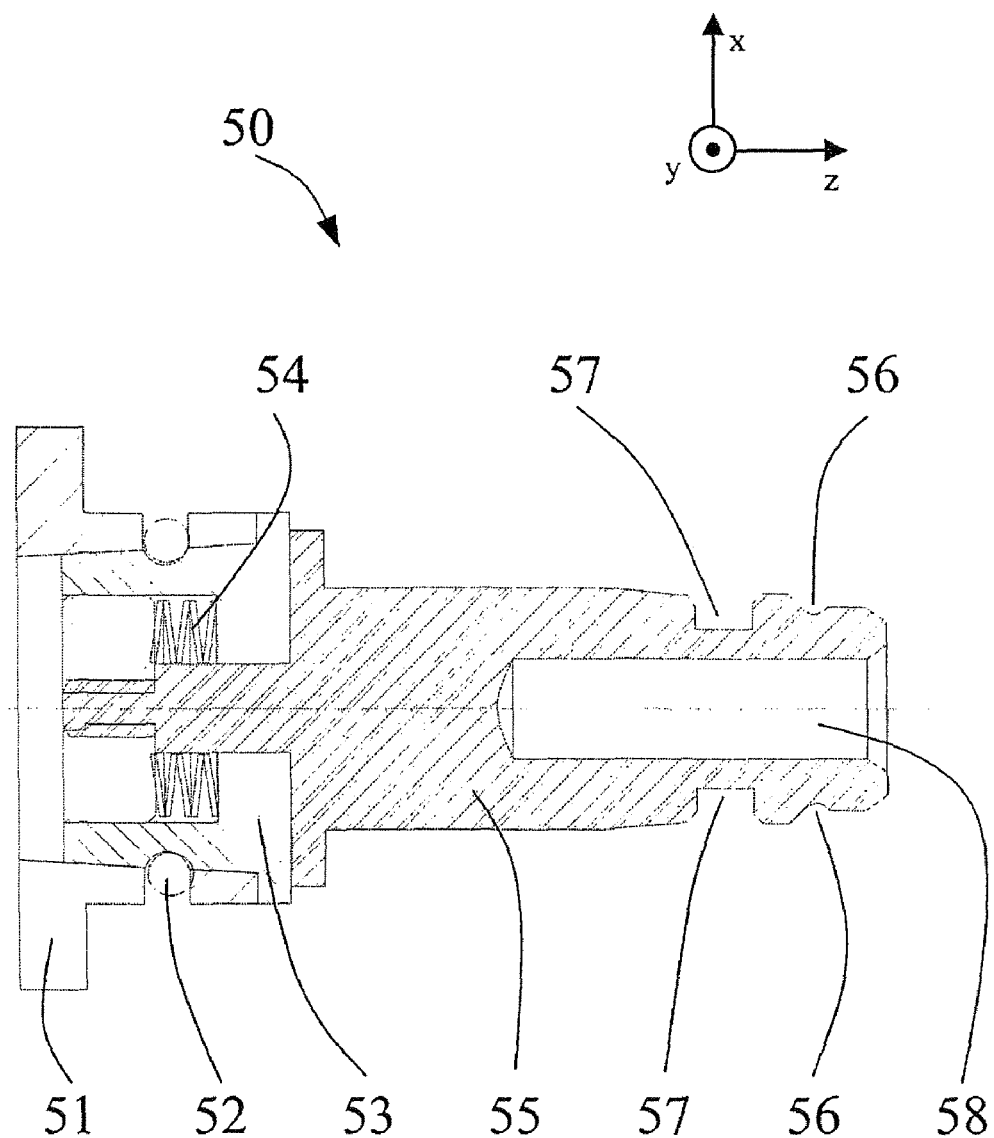
FIG. 3 is a cross sectional view of a locking element.

The locking mechanism 10 is provided with an orifice 17 into which a locking element 50 according to FIG. 3 may be inserted. The locking mechanism 10 comprises a drive 14, 21-28 which causes an engagement and a translational movement of the locking element 50 into the orifice 17 and fixedly holds it in this final state. The drive may be self-arresting.

A synchronising device 11, 12, 13 prevents jamming when the plurality of locking drives of the individual locking mechanisms run simultaneously. In particular it synchronises the operation of the individual locking drives 14 with respect to each other. For this purpose it may be provided with a sensory mechanism 12 and an actuator mechanism 13, for example on/off switches or the like, for each locking drive. A control 11 analyses the signal it receives from the plurality of locking drives 14 of the plurality of locking mechanisms 10 and carries out the synchronisation by appropriately driving the individual drives 14, in particular each one through the actuator mechanism 13 allocated to it. FIG. 2 shows the interaction of the sensory mechanism 12, the controller 11 and the actuator mechanism 13 which is illustrated as a (possibly electronic) switch here. The control 11 also receives the sensor signals from the other locking drives 14 and drives them correspondingly.

The locking drives 14, 21-28 may comprise stepping motors. The sensor 12 may be a position sensor, particularly for the rotational position of the motor 14, or it may be a speed sensor (a rotational speed sensor). In this way the control 11 receives the position or rotational position or the speed of each drive 14 and may carry out appropriate control measures. One strategy may be to reduce the speed of rapidly running motors 14 recognisable with the aid of the respectively incoming signals from the respective sensor 12 so that they run synchronously with the slowest motor 14.

In this way it can be ensured that the operations in the individual locking mechanisms 10 run synchronously with respect to each other and proceed along the path identically. In this way no jams can occur so that the reliable and non-destructive establishment of the mechanical connection and correspondingly also the electrical connection is ensured.

Further an impact sensor (not shown) may be provided which indicates whether or that the locking element has arrived in its final position (at the end of the docking operation). A path sensor for the locking element 50 may also be provided, said path sensor indicating how far the locking element has been inserted into the locking mechanism 10. The control of the docking operation may also be effected in accordance with these sensors (not shown). Further a force measurement may be carried out and a force control may be effected for the docking operation.

The termination of the docking process, in particular of its automated part may be adjusted depending on the signal from the impact sensor mentioned above. It may also be terminated after a certain distance in the z-direction (from the right to the left according to FIG. 2) has been covered, either in accordance with the signal from the sensor 12 which may be converted into a z-position of the docking mechanism 10 or depending on a path sensor which may, for example, be specially provided in the locking mechanism 10 as mentioned above. The termination of the docking process may also be terminated depending on the force to be applied. Since springs are pressed in by spring-biased contact pins during the docking process an increasing force develops along the docking path which must be overcome by the drives. A force sensor provided in the drive strand of the locking mechanism 10 may generate a signal which may be used to adjust the termination of the docking process.

Since a plurality of locking mechanisms 10 is provided a plurality of force sensors or path sensors may be provided correspondingly. Then the signals of a predetermined sensor or the total of the signals from a plurality or all of the sensors (or their mean value) or the respective maximum signal may be used to initiate the termination of the automatic docking operation. The sensor signals used or signals derived from them (total, mean values) may be examined for exceeded threshold values. If threshold values are exceeded, the automatic part of the docking process is terminated.

The termination of the automatic docking process may be brought about by interrupting the current supply to the drives. If they are self-arresting the drives will remain in their last positions. If required braking mechanisms may also be provided.

After the docking process a plurality or all of the electric components of the locking drive (particularly motors, sensors, control, lines) may be disconnected by a turn-off device so that the following measurements are not affected.

The driving is effected as follows in the embodiment shown. On the driving shaft of the motor 14 a V-gear 26 is mounted which drives a V-belt which itself drives a V-gear 24 acting on a worm screw 21. Said worm screw causes a translational movement of the bar 22 in the z-direction, said bar 22 taking along the component 23 and a trapping device 15 as well as a locking device 16 in a manner to be described in more detail. During the docking process the structure in the locking mechanism moves from the right to the left according to FIG. 2. It is shown in the final position at the end of the docking process.

The control 11 may be specially provided for the synchronisation of the locking mechanisms 10. It may be disposed in the docking drive 1 and comprise a digital, signal-processing component. The control 11 may also be formed as a general computer provided, for example, in the testing head and carrying out the control function as one of a plurality of tasks. In the signal flow analogue/digital converters may be provided downstream of the sensory mechanism and digital/analogue converters upstream of the actuator mechanism.

15a and 15b are trapping devices. In the embodiment shown they are spring-loaded elements which are respectively spring-loaded in the direction towards the worm screw 21. At the beginning of the docking process they are, as mentioned, located in a position far right in FIG. 2 together with the bar 22. A correspondingly formed pin of a locking element may be pushed over the worm screw 21 and preliminarily held there by the trapping devices 15a and 15b. The trapping device may also be formed differently and not mechanically resilient, it may, for example, be a magnetic or an electromagnetic device or the like. At the end of the pre-docking operation carried out by the user or operator it temporarily holds a locking element 50 in the pre-docking position so that upon a progress of the actual docking process it may be gripped and held by the locking device 16.

FIG. 3 shows a locking element 50 designed to interact with the locking mechanism 10 shown in FIG. 2. The elongated pin 55 disposed on the left side may be formed so that it is rotationally symmetrical. The orifice 58 is only designed to accommodate the worm screw of the drive. On the outer side of the pin 55 recesses 56 and 57 are provided. The trapping device 15a or 15b may mate with the recess 56. The locking device 16a, 16b may mate with the recess 57. The trapping device 15 and the locking device 16 may be formed so that they act point- or area-wise around the circumference. They need not be present around the whole circumference of the pin.

In the embodiment shown the trapping device 15 and the locking device 16 are provided separately. They may, however, also be combined in a single component. Correspondingly the pin 55 of the locking element 50 would then also be designed differently.

The locking element 50 may comprise a locking section 55, a base 51 and a manually operable connecting mechanism 52-54 provided between the two. It may be manually releasable, in particular without tools. It may, for example, be a withdrawable pin or forelock 52 which, in an inserted state, mortises the locking section 55 and the base 51 so that both are fixedly and frictionally as well as positively connected to each other. The pin or forelock 52 may be designed so that it may be manually pulled out whereby the connection is released. The locking section 55 will then still be inside the hole 17 of the locking mechanism 10, but at least the components can be separated from each other.

FIG. 3 also shows a further embodiment of the locking element. Between the base 51 and the locking section 55 an elastic device 54 may be provided which resiliently retains the locking section 55 opposite of the base 51. The elasticity may be present only in a certain direction, particularly in the z-direction, i.e. the moving direction during the docking process. This also corresponds to the longitudinal direction of the possibly elongated locking section.

Figure 4:
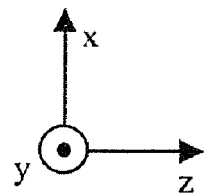
FIG. 4 is a schematic view of mechanical components of the locking mechanism.
Figure 4:
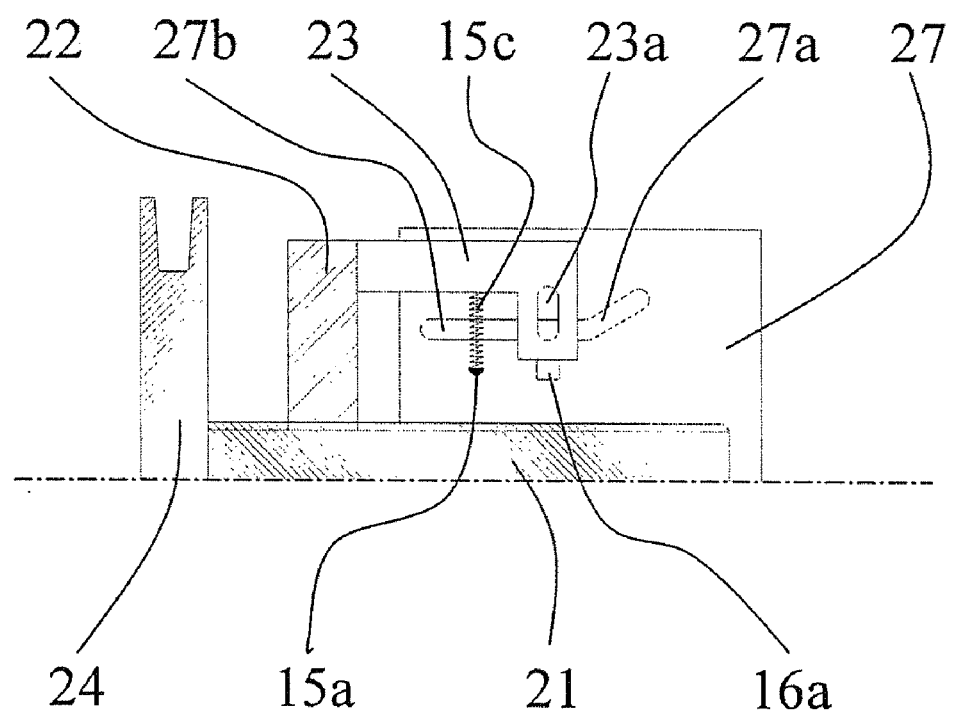
Figure 5:
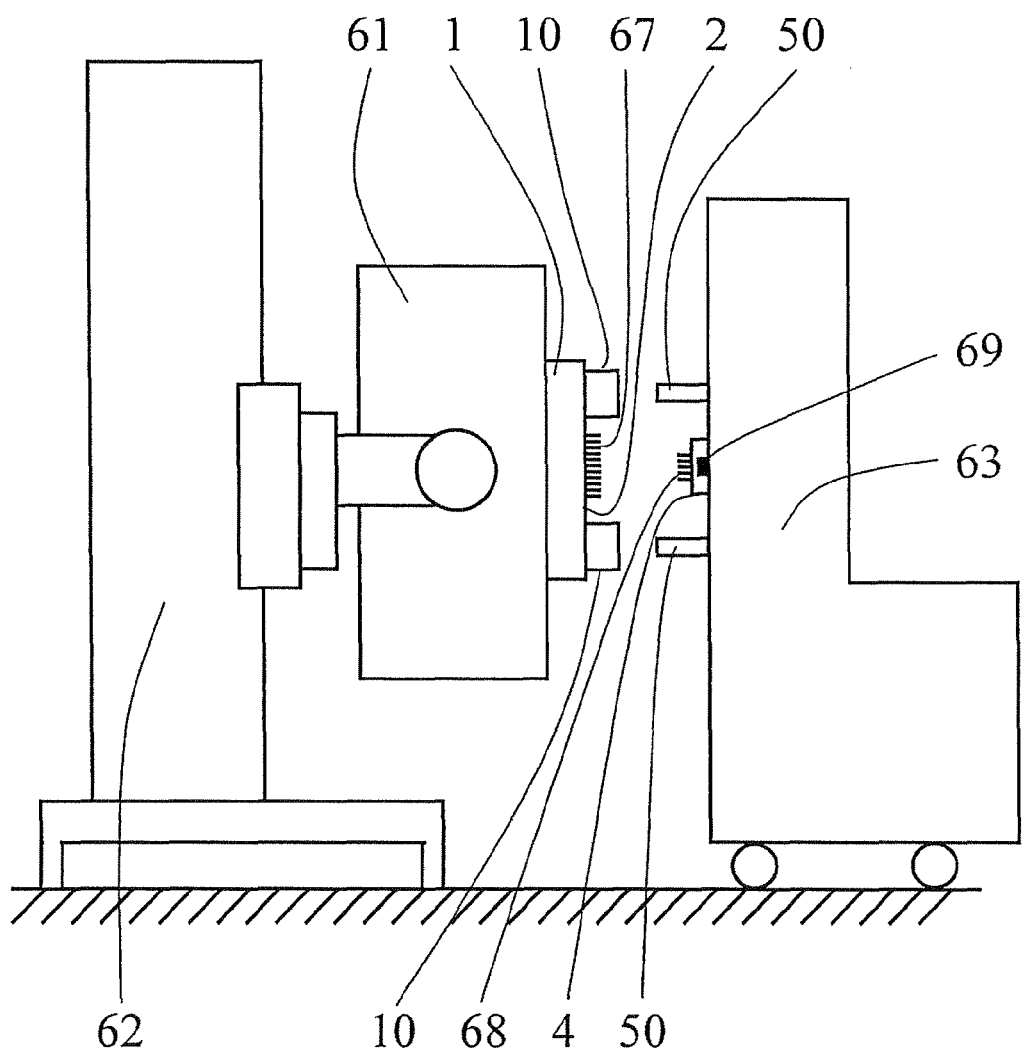
FIG. 5 is a schematic view of a measuring system comprising a testing head 61, a handler or sampler 63, a docking system and further components.

FIG. 4 shows the moving mechanism inside of the locking mechanism 10. The bar 22 and the component 23 are translationally shiftable by means of the worm screw 21. If it is shifted in the z-direction the component 23 takes the trapping device 15a and the locking device 16a along in the z-direction. At the start of the docking process the construction is located further to the right than shown in FIG. 4, namely, in particular, at the right end of the stationary guidance groove 27a, 27b in the stationary component 27. The locking device 16a is a nose which may engage the corresponding groove 57 of the locking element 50. The locking device 16a is guided by the groove 23a in the movable component 23 as well as the guidance groove 27a, 27b in the stationary component 27. When the bar 22 driven by the worm screw is moved to the left from its very right position the locking device 16a carries out a corresponding movement to the right and, in correspondence with the portion 27a of the groove which extends obliquely downwards, a downwards movement. It therefore engages the groove 57 of the locking element 50 shown in FIG. 3 and then takes it along.

15a denotes a trapping device biased by a spring 15c in the direction towards the worm screw 21. At the end of the pre-docking process carried out by the operator the locking element is inserted so that the trapping device 15a engages with the grove and thus preliminarily retains the locking element 50. The retaining force may correspond to a tension force of several kilograms in the z-direction.

The locking section 55 may be formed so that it is globally tapered towards the free end, and it may comprise a cylindrical part having constant cross-sectional dimensions in the opposite direction.

The invention claimed is:

1. A docking system connectable between a testing head and a handler, comprising
    a docking drive for a component of a testing system comprising
    a plurality of locking mechanisms respectively comprising a locking drive, comprising
    a synchronising device synchronising the locking drives of the locking mechanisms, the synchronizing device detecting the slowest locking drive and driving the other locking drives correspondingly.

2. The docking drive according to claim 1, characterised in that the synchronising device comprises
    a sensor for each locking drive and
    a control receiving the signals from the sensors and driving all of the locking drives in accordance with the signals.

3. The docking drive according to claim 2, characterised in that the sensor is a path sensor or a speed sensor.

4. The docking drive according to claim 2, characterised in that at least one said sensor is a force sensor.

5. The docking drive according to claim 1, characterised in that the synchronising device detects the slowest locking drive and drives the other locking drives correspondingly.

6. The docking drive according to claim 1, characterised by a sensory mechanism for controlling termination of the docking process.

7. The docking drive according to claim 6, characterised in that the sensory mechanism comprises an impact sensor or a path sensor or a force sensor.

8. The docking drive according to claim 1, further comprising a turn-off device for disconnecting the electrical components of the docking drive after the docking process.

9. The docking drive according to claim 1, wherein the locking drive is self-arresting.

* * * * *